(12) United States Patent
Larsson et al.

(10) Patent No.: US 12,495,625 B2
(45) Date of Patent: Dec. 9, 2025

(54) HIGH-SPEED, LARGE-AREA SEPARATE ABSORPTION AND DRIFT PHOTODETECTOR

(71) Applicant: Mellanox Technologies, Ltd., Yokneam (IL)

(72) Inventors: Anders Gosta Larsson, Hovås (SE); Attila Fülöp, Gothenburg (SE); Oren Steinberg, Tal Shahar (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 906 days.

(21) Appl. No.: 17/652,989

(22) Filed: Mar. 1, 2022

(65) Prior Publication Data
US 2022/0285419 A1    Sep. 8, 2022

Related U.S. Application Data

(60) Provisional application No. 63/155,326, filed on Mar. 2, 2021.

(51) Int. Cl.
| | |
|---|---|
| *H10F 39/18* | (2025.01) |
| *H10F 30/223* | (2025.01) |
| *H10F 39/00* | (2025.01) |
| *H10F 77/124* | (2025.01) |

(52) U.S. Cl.
CPC .......... *H10F 39/18* (2025.01); *H10F 30/223* (2025.01); *H10F 39/806* (2025.01); *H10F 77/1248* (2025.01)

(58) Field of Classification Search
CPC ...... H10F 39/18; H10F 39/806; H10F 30/223; H10F 77/1248
USPC ........................................................ 257/432
See application file for complete search history.

(56) References Cited

U.S. PATENT DOCUMENTS 10,401,543 B1 *    9/2019    Shi ........................... G02B 5/22

* cited by examiner

*Primary Examiner* — Norman D Richards
(74) *Attorney, Agent, or Firm* — R.W. McCord Rayburn; Moore & Van Allen PLLC

(57) ABSTRACT

Various embodiments provide a PIN-photodetector configured to detect light characterized by a particular wavelength range. The photodetector includes an absorber region including a material having an absorption coefficient of greater than $10^4$ cm$^{-1}$ in the particular wavelength range. The absorber region has an absorber thickness in a direction that is substantially parallel to a detection axis of the photodetector. The photodetector further includes a collector region including a material that is substantially transparent to the particular wavelength range. The collector region has a collector thickness in the direction that is substantially parallel to the detection axis. The collector thickness is greater than the absorber thickness. The absorber region does not spatially overlap with the collector region. The photodetector is configured to operate at a bandwidth of at least 50 GHz.

20 Claims, 5 Drawing Sheets

HIGH-SPEED, LARGE-AREA SEPARATE ABSORPTION AND DRIFT PHOTODETECTOR

CROSS-REFERENCE TO RELATED APPLICATIONS

This application claims priority to U.S. Application No. 63/155,326, filed Mar. 2, 2021, the content of which is hereby incorporated by reference in its entirety.

BACKGROUND

As data communication demands increase in both volume and speed, optical communications have become an increasingly popular communication approach. For optical communications to meet these growing demands, both high speed transmitters and high speed receivers are required.

BRIEF SUMMARY

Photodetectors, such as photodiodes, are electro-optical devices configured to receive light through an aperture thereof and convert the light into an electrical signal. Various embodiments provide a photodetector comprising separate light absorption and electron drift/collector regions. In various embodiments, the separate light absorption and electron drift/collection regions enable the photodetector to operate at a bandwidth equal to or greater than 50 GHz. In various embodiments, the photodetector is configured for use with a multi-mode fiber and to operate with a bandwidth equal to or greater than 50 GHz.

According to an aspect of the present disclosure, a photodetector is provided. In an example embodiment, the photodetector is configured to detect light characterized by a particular wavelength range. The photodetector comprises an absorber region comprising a material having an absorption coefficient of greater than $10^4$ cm$^{-1}$ in the particular wavelength range. The absorber region has an absorber thickness in a direction that is substantially parallel to the detection axis of the photodetector. The photodetector further comprises a collector region comprising a material that is substantially transparent to the particular wavelength range. The collector region has a collector thickness in the direction that is substantially parallel to the detection axis. The collector thickness is greater than the absorber thickness. The absorber region does not spatially overlap with the collector region. The photodetector is configured to operate at a bandwidth of at least 50 GHz.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION OF THE INVENTION

Figure 1A:
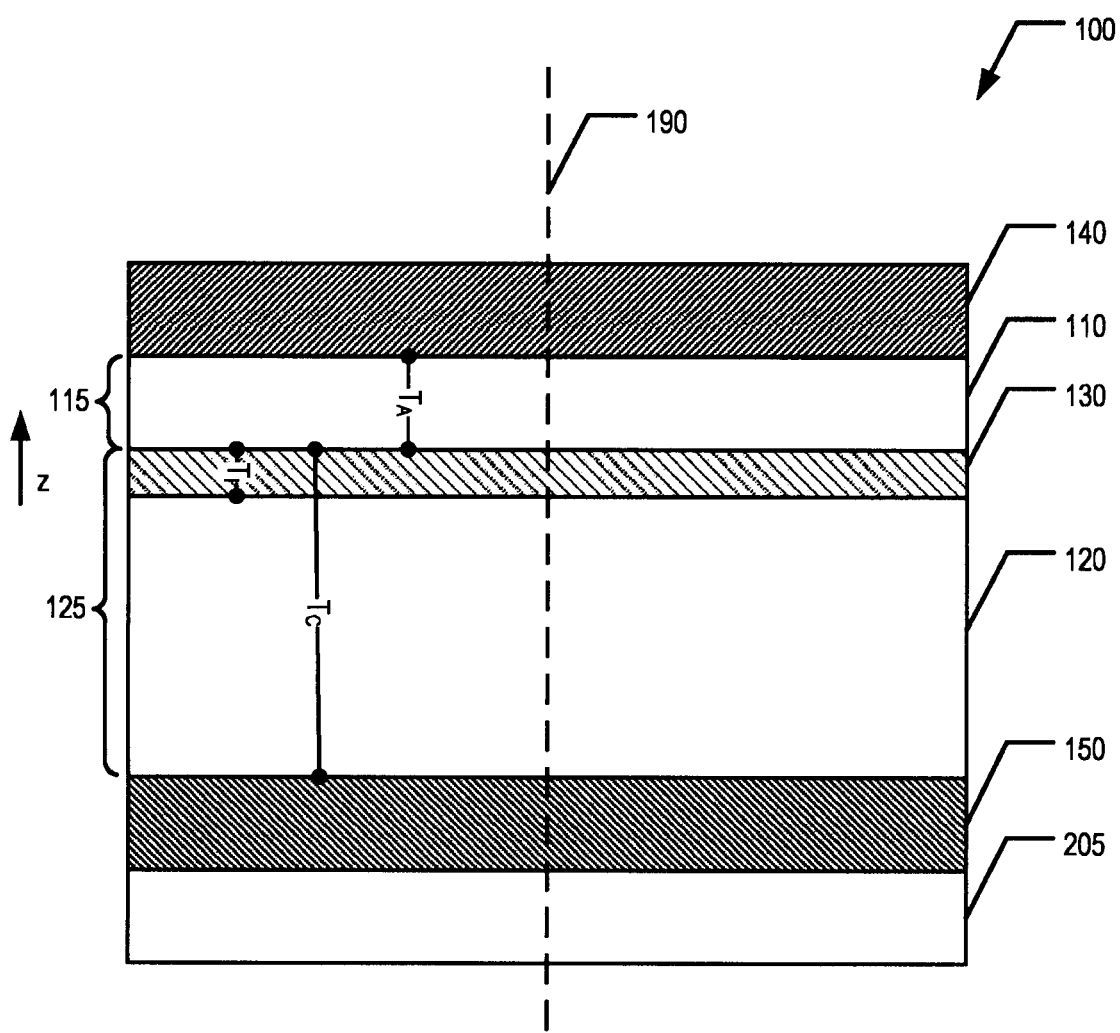
FIG. 1A illustrates a cross-section of an example mesa structure of a photodetector having separate light absorption and drift/collection regions, in accordance with an example embodiment.

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "about," "around," etc. are used for explanatory purposes in the examples provided below to describe the relative position of certain components or portions of components. As used herein, the terms "substantially" and "approximately" refer to tolerances within manufacturing and/or engineering standards.

Various embodiments provide a photodetector, such as a PIN-type photodetector and/or a photodiode (e.g., a PIN photodiode), for example, configured to be operated with a bandwidth of at least 50 GHz. In various embodiments, the photodetector comprises separate light absorption and electron drift/collector regions. For example, in various embodiments, the photodetector comprises an absorber region and a drift/collector region that do not spatially overlap. In various embodiments, the separate light absorption and electron drift/collection regions enable the photodetector to operate at a bandwidth equal to or greater than 50 GHz. In various embodiments, the photodetector is configured for use with a multi-mode optical fiber and to operate at a bandwidth equal to or greater than 50 GHz.

Multi-mode optical fibers have optical cores with diameters of 50 μm and 62.5 μm, which are significantly larger than the 8-10 μm core diameters of single-mode optical fibers. Thus, for a photodetector to be configured for use with a multi-mode optical fiber, the optical window of the photodetector must be large enough to enable efficient coupling to the large diameter optical core of a multi-mode optical fiber. This results in a mesa diameter of the photodetector mesa structure that is required to be significantly larger than what is required for efficient coupling to a single-mode optical fiber. However, the capacitance of the photodetector, which is inversely related to the bandwidth at which the photodetector can operate, is a function of the mesa diameter of the photodetector. In other words, a photodetector configured to operate with a multi-mode fiber has significantly more capacitance, and therefore lower bandwidth capabilities, than a photodetector configured to operate with a single-mode optical fiber. Conventional photodetectors configured for use with multi-mode optical fibers are limited to bandwidths of about 30 GHz. As new generations of optical communications systems require bandwidths of at least 50 GHz (e.g., data rates of 224 gigabits per second), technical problems exist regarding photodetectors that are capable of efficient optical coupling to multi-mode optical fibers and that are able to operate at sufficiently high bandwidth.

Various embodiments provide technical solutions to these technical problems. Various embodiments provide photodetectors comprising separate absorber regions and drift/collector regions that are configured to provide sufficiently high bandwidth even when the mesa diameter and optical window of the photodetector are sufficiently large enough for efficient optical coupling to a multi-mode optical fiber. Thus, various embodiments provide photodetectors that exhibit technical advantages and improvements over conventional photodetectors.

Example Photodetector Layer Structure and Band Diagram

Figure 1B:
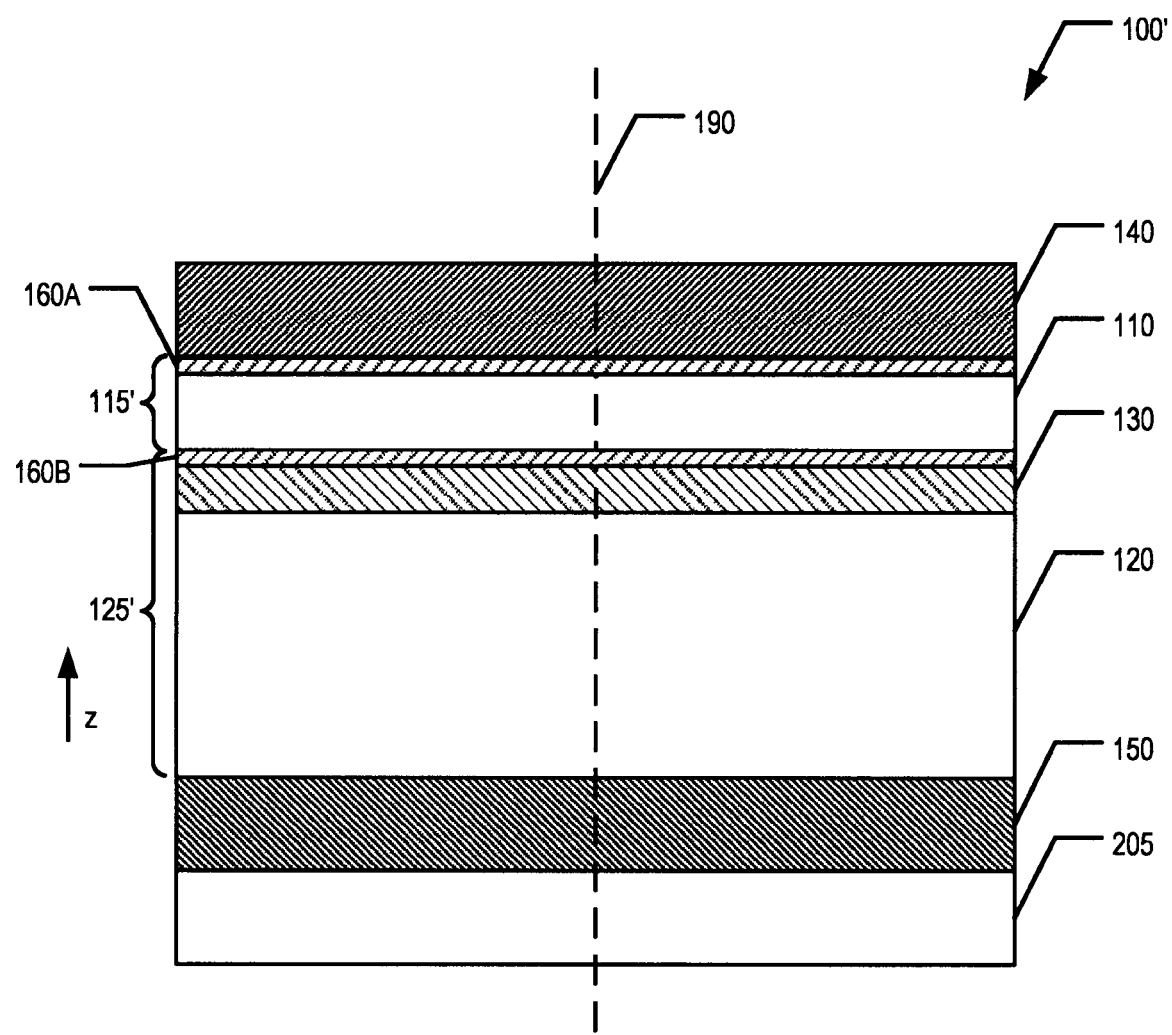
FIG. 1B illustrates a cross-section of another example mesa structure of a photodetector having separate light absorption and drift/collection regions, in accordance with another example embodiment.

FIG. 1A illustrates a cross-section of a layer structure 100 of an example embodiment of a photodetector 200 (see FIG. 2) taken in a plane that is substantially parallel to the detection axis 190 of the photodetector 200. FIG. 1B illustrates a cross-section of another layer structure 100' of an example embodiment of a photodetector taken in a plane that is substantially parallel to the detection axis 190 of the photodetector. The layer structure 100' is similar to that of the layer structure 100, but further includes interface layers 160A and 160B.

In various embodiments, the layer structure 100, 100' is configured to detect light in a particular wavelength range. In various embodiments, the particular wavelength range is 960 to 1200 nm. In an example embodiment, the particular wavelength range is 980 to 1100 nm. In an example embodiment the particular wavelength range is and/or comprises 980 nm. In various embodiments, the layer structure 100, 100' is configured for use with multi-mode optical fibers or single-mode optical fibers and to operate at bandwidths greater than 50 GHz and 100 GHz, respectively.

In various embodiments, the layer structure 100, 100' is formed on a substrate 205. For example, the substrate 205 may be an InP substrate and/or the like.

In various embodiments, the layer structure 100, 100' comprises an absorber region 115, 115' and a drift/collector region 125, 125'. In various embodiments, the absorber region 115, 115' and the drift/collector region 125, 125' are aligned with one another along the photodetector axis 190. In various embodiments, the absorber region 115, 115' is adjacent to and/or abuts the drift/collector region 125, 125'. However, the absorber region 115, 115' and the drift/collector region 125, 125' do not overlap.

In various embodiments, the absorber region 115 has an absorber thickness $T_A$ in a direction substantially parallel to the detection axis 190 and the drift/collector region 125 has a collector thickness $T_C$ in the direction substantially parallel to the detection axis 190. In various embodiments, the collector thickness is (substantially) greater than the absorber thickness ($T_C > T_A$). For example, in various embodiments, the absorber thickness $T_A$ is 0.1 to 0.6 μm (e.g., approximately 0.25 μm). In various embodiments, the collector thickness $T_C$ is in the range of 1 to 3 μm (e.g., approximately 2 μm).

In various embodiments, the absorber region 115, 115' comprises an absorber layer 110. The absorber layer 110 comprises and/or consists of a material having an absorption coefficient of greater than $5 \times 10^3$ cm$^{-1}$ in the particular wavelength range. In various embodiments, the absorber layer 100 comprises and/or consists of a material having an absorption coefficient of greater than $10^4$ cm$^{-1}$, $10^5$ cm$^{-1}$, or greater in the particular wavelength range. In particular, the absorption coefficient of the absorber layer 110 is sufficiently high enough for the absorption length for an optical beam or optical signals in the particular wavelength range to be less than or equal to the absorber thickness $T_A$.

In various embodiments, the absorber region 115 and/or the absorber layer 110 comprises InGaAs and/or InGaAsP. In various embodiments, the absorber region 115 and/or the absorber layer 110 comprises intrinsic (and/or un-doped) InGaAs and/or InGaAsP. For example, the material of the absorber layer 110 has a designed dopant density of less than $3 \times 10^{14}$ cm$^{-3}$, in an example embodiment. In various embodiments, the crystal structure of the absorber region 115 and/or absorber layer 110 is lattice-matched to the crystal structure of the collector region 125, 125' (e.g., the intermediate layer 130 of the collector region 125, interface layer 160B, or the collector layer 120). For example, in various embodiments, the layer structure 100, 100' is formed on an InP substrate and each layer of the layer structure 100, 100' (including the absorber region 115 and/or absorber layer 110) is lattice-matched to the InP (of the InP substrate and/or collection region 125, 125').

In various embodiments, the drift/collector region 125, 125' comprises a collector layer 120. The collector layer 120 comprises and/or consists of a material that is substantially transparent in the particular wavelength range. In various embodiments, the collector layer 120 comprises and/or consists of a material that is substantially transparent in the particular wavelength range because the absorption coefficient of the material at the particular wavelength is sufficiently small. For example, in various embodiments, the collector layer 120 comprises and/or consists of a material having an absorption coefficient that is less than $10^3$ cm$^{-1}$, or $10^2$ cm$^{-1}$ in the particular wavelength range. In particular, the absorption coefficient of the collector layer 120 may be sufficiently low to allow the absorption length for an optical beam or optical signals in the particular wavelength range to be greater (e.g., much greater) than the collector thickness $T_C$.

In various embodiments, the drift/collector region 125, 125' and/or the collector layer 120 comprises InP. In an example embodiment, the collector layer 120 comprises and/or consists of intrinsic (and/or undoped) InP. For example, the material of the collector layer 120 has a dopant density of less than $3 \times 10^{14}$ cm$^{-3}$, in an example embodiment.

In various embodiments, the drift/collector region 125, 125' comprises an intermediate layer 130. In various embodiments, the intermediate layer 130 is disposed between the absorber layer 110 and the collector layer 120. In various embodiments, the intermediate layer 130 is a doped layer. For example, in various embodiments, the intermediate layer 130 comprises and/or consists of n-type doped InP, InGaAsP, or InGaAlAs. In various embodiments, the intermediate layer 130 is doped to a dopant density of $5 \times 10^{16}$ to $5 \times 10^{18}$ cm$^{-3}$ (e.g., approximately $1 \times 10^{17}$ cm$^{-3}$).

The intermediate layer 130 is, in various embodiments, doped so as to control the electric fields in the absorber region 115, 115' and the drift/collector region 125, 125'. For example, the intermediate layer 130 is doped so that when an appropriate bias voltage is applied to the photodetector (e.g., via contact pads 226, 236 of photodetector 200), respective appropriate electric fields are generated within the collector layer 120 and the absorber layer 110. In various embodiments, when a bias voltage in a range 1-5 V is applied to the photodetector (e.g., via contact pads 226, 236 of photodetector 200), an electric field is generated within the collector layer 120 and the absorber layer 110 that causes the collector layer 120, drift/collector region 125, 125', absorber layer 110, and/or absorber region 115, 115' to be substantially depleted of free charge carriers.

For example, when a bias voltage in a range of 1-5 V is applied to the photodetector (e.g., via contact pads 226, 236 of photodetector 200), an electric field is generated within the collector layer 120 having an amplitude in the range of 5 to 15 kV/cm (e.g., approximately 10 kV/cm). For example, in various embodiments, the amplitude of the electric field in the collector layer 120 (e.g., 5 to 15 kV/cm) is selected so as to maximize the electron velocity and/or to minimize the electron travel time across the collector layer 120. In various embodiments, the electric field generated within the collector layer 120 causes electrons within the collector layer 120 to be transported away from the intermediate layer 130 toward the second peripheral layer 150 (e.g., in the negative z-direction). For example, when a bias voltage in a range of 1-5 V is applied to the photodetector (e.g., via contact pads 226, 236 of the photodetector 200), an electric field is generated within the absorber layer 110 having an amplitude of greater than 30 kV/cm. For example, in an example embodiment, the electric field generated within the absorber layer 110 has an amplitude in the range of 30 to 50 kV/cm (e.g., approximately 40 kV/cm). For example, in various embodiments, the amplitude of the electric field in the absorber layer 110 (e.g., 30 to 50 kV/cm) is selected so as to cause the holes to reach their saturation velocity. In various embodiments, the electric field generated within the absorber layer 110 causes holes within the absorber layer 110 to be transported away from the intermediate layer 130 toward the first peripheral layer 140 (e.g., in the positive z-direction).

In various embodiments, the intermediate layer 130 has an intermediate thickness $T_I$ in a direction substantially parallel to the detection axis 190 of the photodetector. In various embodiments, the intermediate thickness $T_I$ is in the range of 3 to 300 nm (e.g., approximately 30 nm).

In various embodiments, the layer structure 100, 100' comprises a first peripheral layer 140. In various embodiments, the first peripheral layer 140 is disposed adjacent the absorber region 115, 115' along the detection axis 190. For example, the first peripheral layer 140 is disposed such that the absorber region 115, 115' is disposed between the first peripheral layer 140 and the drift/collector region 125, 125'.

In various embodiments, the first peripheral layer 140 comprises p-type doped InP or p-type doped InAlAs. In various embodiments, the first peripheral layer 140 is highly doped with a p-type dopant. For example, the first peripheral layer 140 may be doped with a p-type dopant to a dopant density of greater than $5\times10^{17}$ cm$^{-3}$.

In various embodiments, the layer structure 100, 100' comprises a second peripheral layer 150. In various embodiments, the second peripheral layer 150 is disposed adjacent the drift/collector region 125, 125' along the detection axis 190. For example, the second peripheral layer 150 may be disposed such that the drift/collector region 125, 125' is disposed between the second peripheral layer 150 and the absorber region 115, 115'.

In various embodiments, the second peripheral layer 150 comprises n-type doped InP. In various embodiments, the second peripheral layer 150 is highly doped with an n-type dopant. For example, the second peripheral layer 150 may be doped with an n-type dopant to a dopant density of greater than $5\times10^{17}$ cm$^{-3}$.

Figure 3A:
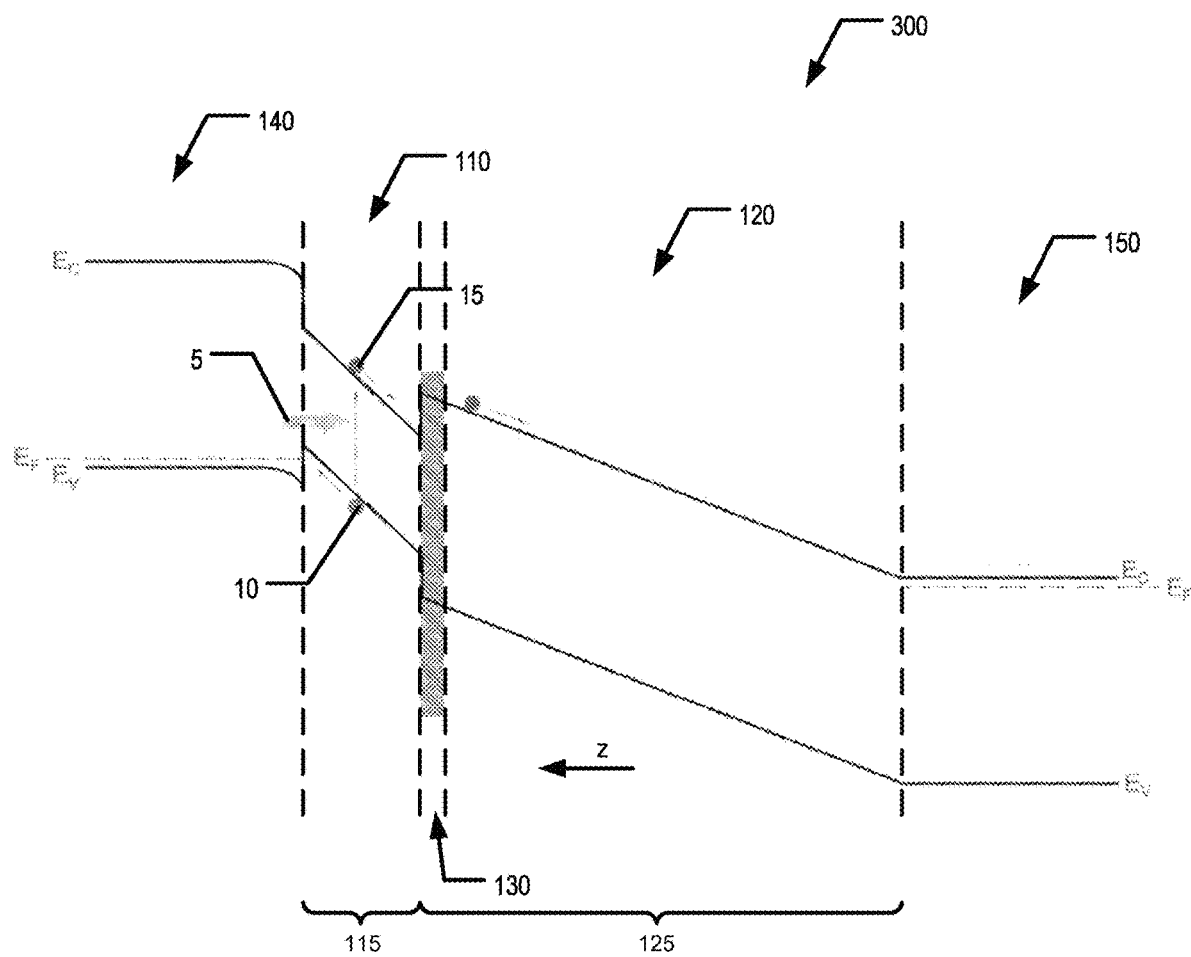
FIG. 3A is a band gap diagram for the example mesa structure illustrated in FIG. 1A, in accordance with an example embodiment.

FIG. 3A illustrates a band diagram 300 for the layer structure 100. The band diagram 300 illustrates the conduction band energy $E_C$, valence band energy $E_V$, Fermi energy $E_F$ across the layer structure 100 in a direction substantially parallel to the detection axis 190. In some embodiments, light 5 (e.g., an optical beam, optical signal, and/or the like characterized by the particular wavelength range and/or one or more wavelengths within the particular wavelength range) enters the layer structure 100 through the first peripheral layer 140 traveling in the negative z-direction. The light 5 interacts with material within the absorber layer 110 to generate free holes 10 and free electrons 15. The free holes 10 are accelerated toward the first peripheral layer 140 by the electric field within the absorber region 115 (and is controlled by the intermediate layer 130). The free electrons 15 are accelerated across the absorber layer 110 and the collector layer 120 and toward the second peripheral layer 150 by the electric fields within the absorber region 115 and the collector region 125 (and is controlled by the intermediate layer 130). For example, the free holes 10 are substantially accelerated in the positive z-direction and the free electrons 15 are substantially accelerated in the negative z-direction.

As should be understood, the z-direction is substantially parallel to the detection axis 190. In an example embodiment, the primary direction of acceleration of the free holes 10 and/or free electrons defines the z-direction and/or detection axis 190.

Similar detection events occur when light 5 enters the layer structure 100 from through the second peripheral layer 150. In particular, the light 5 passes through the drift/collector region 125 (which is substantially transparent to the light 5) and interacts with material in the absorber region 115 (which is an efficient absorber of light 5). The resulting free holes are accelerated toward the first peripheral layer 140 and the resulting free electrons are accelerated toward the second peripheral layer 150.

In various embodiments, a photodetector 200 comprising the layer structure 100 further comprises a first contact pad 226 in electrical communication with the first peripheral layer 140 and a second contact pad 236 in electrical communication with the second peripheral layer 150. In various embodiments, the photodetector 200 is configured such that an external voltage source may apply a voltage difference to the first contact pad 226 and the second contact pad 236. For example, one of contact pads 226, 236 may be electrically connected to ground and the other of the contact pads 226, 236 may have a non-zero voltage applied thereto. In various embodiments, the voltage difference is in the range of 1 to 5 V. In various embodiments, the voltage difference is a reverse bias voltage. In an example embodiment, the applied voltage difference (and the doping of the intermediate layer 130) is configured such that the change in voltage across the absorber layer 110 and/or the absorber region 115, 115' is in the range of 0.5 to 2 V (e.g., approximately 1 V). In an example embodiment, the applied voltage difference (and the doping of the intermediate layer 130) is configured such that the change in voltage across the collector layer 120 and/or the drift/collector region 125, 125' is in the range of 0.5 to 3 V (e.g., approximately 2 V).

As noted above, the primary difference between the layer structure 100 and the layer structure 100' is the inclusion of interface layers 160A, 160B in the layer structure 100'. In various embodiments, the interface layers 160A, 160B are configured to be intermediate bandgap interface layers. For example, in various embodiments, the interface layers 160A, 160B are configured to ease the transport of free holes 10 and/or free electrons 15 across the interface between the absorber layer 110 and the first peripheral layer 140 and/or between the absorber layer 110 and the drift/collector region 125, 125'.

In various embodiments, the interface layers 160A, 160B are thin layers (e.g., having a thickness in a direction substantially parallel to the detection axis 190 of up to 0.2 μm). In various embodiments, the interface layers 160A, 160B are lattice-matched to a respective peripheral layer (e.g., the first interface layer 160A may be lattice-matched to first peripheral layer 140, and the second interface layer 160B may be lattice-matched to second peripheral layer 150), the absorber layer 110, the intermediate layer 130, and/or the collector layer 120. In various embodiments, the interface layers 160A, 160B comprise InGaAsP or InGaAlAs. In various embodiments, the interface layers 160A, 160 comprise undoped and/or intrinsic InGaAsP or InGaAlAs. In various embodiments, the interface layers 160A, 160B are lattice-matched to the collector layer 120 (e.g., InP).

Figure 3B:
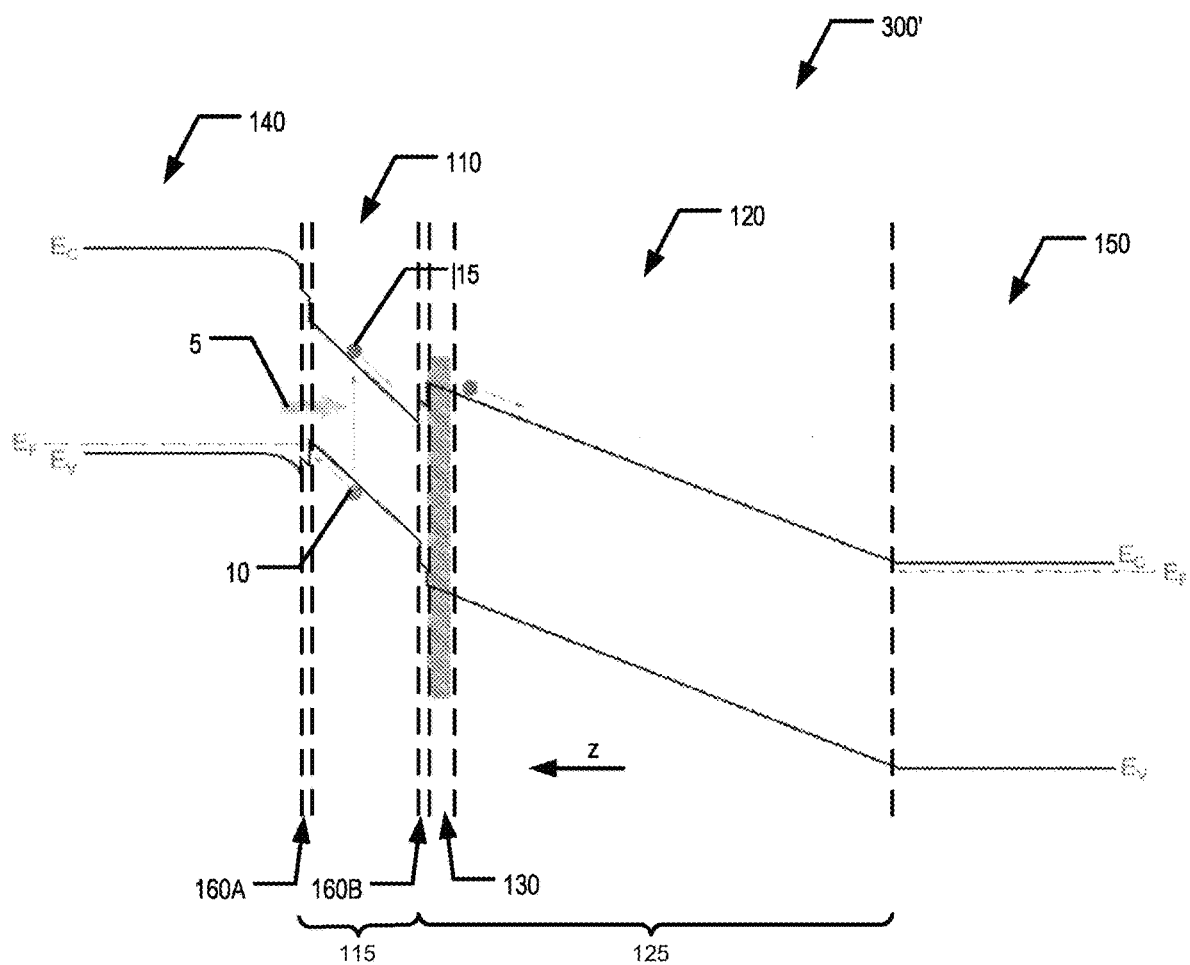
FIG. 3B is a band gap diagram for the example mesa structure illustrated in FIG. 1B, in accordance with an example embodiment.

FIG. 3B illustrates a band diagram 300' for the layer structure 100'. As shown in the band diagram 300', the inclusion of the intermediate bandgap interface layers (e.g., interface layers 160A, 160B) cause the changes in the valence band energy and the conduction band energy across the interfaces between the first peripheral layer 140 and the absorber layer 110 and between the absorber layer 110 and the intermediate layer 130 to include two smaller steps and/or discontinuities compared to the larger single discontinuity at the interfaces between the first peripheral layer 140 and the absorber layer 110 and between the absorber layer 110 and the intermediate layer 130 shown in band diagram 300. In various embodiments, the multi-step interfaces of the layer structure 100' (as illustrated in band diagram 300') enable more effective transport of free carriers (e.g., free holes and/or free electrons) across the respective interfaces compared to the single-step interface of the layer structure 100 (as illustrated in band diagram 300).

For example, the potential barrier experienced by a free hole crossing the interface from the absorber layer 110 to the first peripheral layer 140 is approximately 360 meV. When the first interface layer 160A is present between the absorber layer 110 and the first peripheral layer, this potential barrier is broken into two potential barriers that are each less than 200 meV (e.g., 100-180 meV), resulting in less trapping of the photogenerated free holes and free electrons at the interfaces.

Example Photodetector 200

Figure 2:
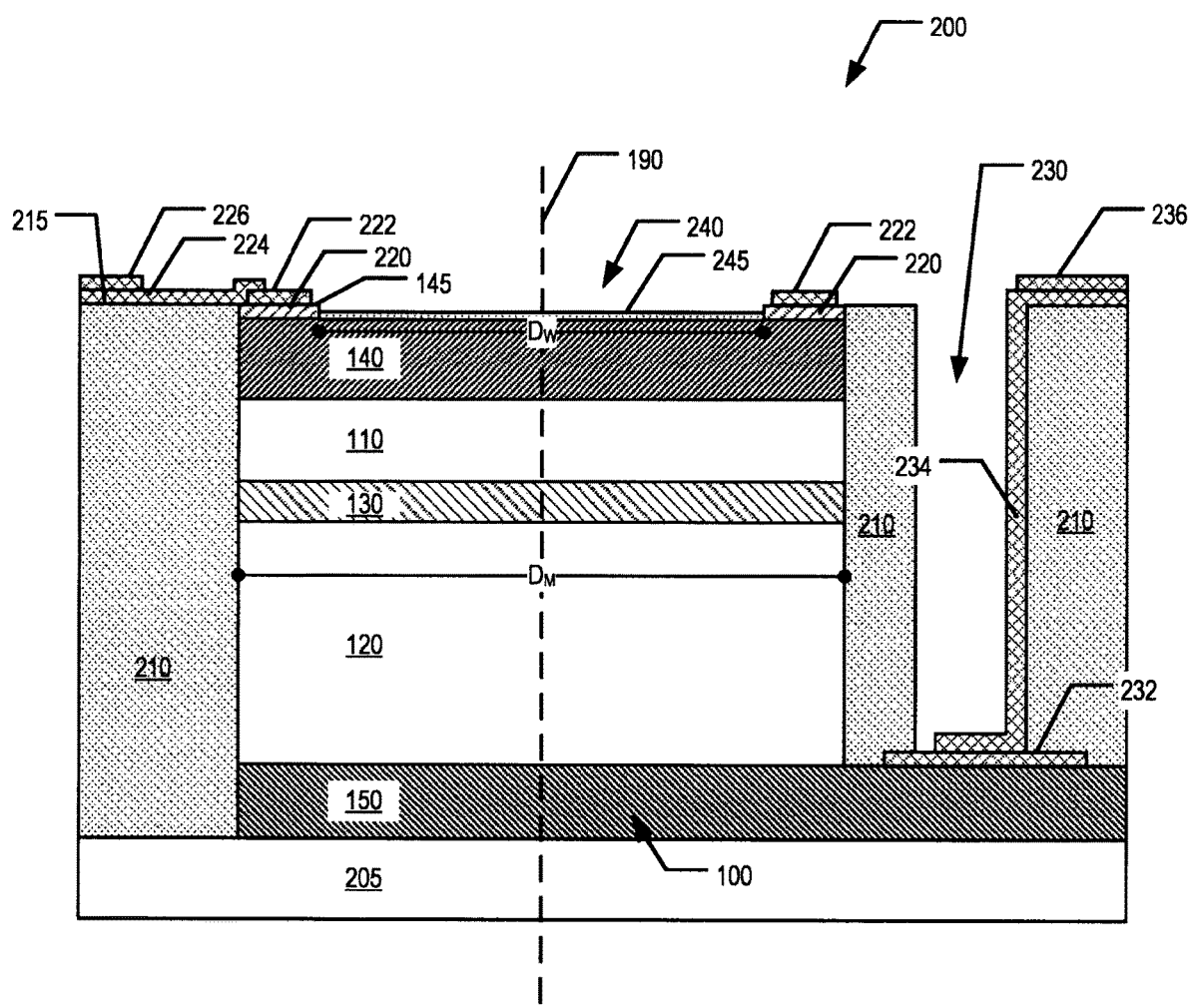
FIG. 2 illustrates a cross-section of an example photodetector comprising the mesa structure shown in FIG. 1A, in accordance with an example embodiment.

FIG. 2 illustrates a cross-section of a photodetector 200 taken in a plane substantially parallel to the detection axis 190 of the photodetector 200. In the illustrated embodiment, the photodetector 200 is a PIN-type photodiode. The illustrated embodiment of photodetector 200 comprises a layer structure 100. In various embodiments, the photodetector 200 comprises a layer structure 100' or other mesa structure comprising an absorber region and a drift/collector region where the absorber region is an efficient absorber of light characterized by the particular wavelength range, the drift/collector region is substantially transparent to light characterized by the particular wavelength range, the drift/collector region is thicker than the absorber region, and the absorber region and the drift/collector region do not spatially overlap.

As shown in the illustrated embodiment of the photodetector 200, the layer structure 100 is formed and/or fabricated on a substrate 205. In various embodiments, the substrate 205 comprises and/or consists of undoped and/or semi-insulating InP. In various embodiments, the substrate 205 may comprise and/or be formed of one or more other appropriate materials.

In various embodiments, a cladding 210 is disposed about the layer structure 100 of the photodetector 200. In various embodiments, the cladding 210 comprises benzo-cyclobutene (BCB) and/or another insulating and/or dielectric material (e.g., an oxide, a polyimide, and/or the like) having a low dielectric constant. In an example embodiment, the cladding 210 is configured such that an exposed surface 145 of the photodetector 200 and an exposed surface 215 of the cladding 210 are substantially planar with respect to one another. In an example embodiment, the cladding 210 is configured to at least partially enclose the layer structure 100 and/or to electrically and/or environmentally isolate the layer structure 100 from surroundings thereof.

In various embodiments, the photodetector 200 comprises a first contact layer 220 electrically coupled to the first peripheral layer 140. For example, the first contact layer 220 is disposed on the first peripheral layer 140. In various embodiments, the first contact layer 220 is configured to provide a low resistance electrical connection to the first peripheral layer 140. In an example embodiment, the first contact layer 220 comprises InGaAs. In various embodiments, the first contact layer 220 comprises heavily p-type doped InGaAs. In various embodiments, the first contact layer 220 is removed from the optical window 240 of the photodetector 200. For example, any portion of the first contact layer 220 present in the optical window 240 after the forming of the first contact layer 220 may be removed (via etching, for example) such that the optical window 240 does not contain the first contact layer 220 and undesired absorption of light incident on the optical window by the first contact layer 220 is prevented.

In various embodiments, a metallized contact 222 is disposed on the first contact layer 220. In various embodiments, the metallized contact 222 comprises Ti, Pt, and/or Au. In an example embodiment, an annealing process is used to reduce the resistance between the metallized contact 222 and the first contact layer 220.

A first conductive element 224 is disposed on a portion of the exposed surface 215 of the cladding 210. A first contact pad 226 is disposed on at least a portion of the first conductive element 224. In various embodiments, the first conductive element 224 is configured to electrically couple the first contact pad 226 to the first peripheral layer 140 via the metallized contact 222 and the first contact layer 220. For example, the first contact pad 226, first conductive element 224, and/or metalized contact 222 comprise metal (e.g., Au, Pt, Ti, and/or the like) or other conductive material, in various embodiments.

In various embodiments, the photodetector 200 comprises a second-side contact layer 232 electrically coupled to the second peripheral layer 150. For example, the second contact layer 232 may be disposed on the second peripheral layer 150. In various embodiments, the second contact layer 232 is configured to provide a low resistance electrical connection to the second peripheral layer 150. In an example embodiment, the second contact layer 232 comprises AuGe/Ni. For example, the second contact layer 232 may be formed via AuGe and/or Ni metallization. In an example embodiment, an annealing process is used to reduce the electrical resistance between the second contact layer 232 and the second peripheral layer 150.

In various embodiments, access to the second contact layer 232 is provided via an access trench 230 that extends through the cladding 210 from the exposed surface 215 of the cladding to the second contact layer 232. For example, a second conductive element 234 extends from the exposed surface 215 to the second contact layer 232. In various embodiments, the photodetector 200 comprises a second contact pad 236. The second contact pad 236 is formed on a portion of the second conductive element 234 (e.g., a portion formed on the exposed surface 215 of the cladding 210). In various embodiments, the second contact pad 236 and/or the second conductive element 234 comprise metal (e.g., Au, Pt, Ti, and/or the like). In an example embodiment, the access trench 230 is configured to electrically isolate the first contact layer 220 and/or metallized contact 222 from the second contact pad 236, second conductive element 234, and/or the like.

In various embodiments, the layer structure 100 defines a mesa diameter $D_M$ in a direction that is transverse (e.g., perpendicular) to the detection axis 190. In various embodiments, the mesa diameter $D_M$ is a characteristic width of the layer structure 100. In various embodiments, the first contact layer 220 and/or metallized contact 222 define an optical window 240 of the photodetector 200. For example, in an example embodiment, the first contact layer 220 and/or metallized contact 222 are at least partially annular in shape (e.g., when viewed in plane substantially perpendicular to the detection axis 190. The aperture and/or opening in the first contact layer 220 and/or metallized contact 222 defines the optical window 240 of the photodetector 220. In various embodiments, the optical window 240 defines a window diameter $D_W$. In various embodiments, the window diameter $D_W$ is a characteristic width of the optical window 240.

In various embodiments, the optical window 240 and/or the layer structure 100 is configured for use with a multi-mode optical fiber. For example, the window diameter $D_W$ and/or the mesa diameter $D_M$ may be configured to enable efficient optical coupling to a multi-mode optical fiber. In various embodiments configured for use and/or coupling to a multi-mode optical fiber, the window diameter $D_W$ is 15, 20, or 25 μm or wider (e.g., up to 62.5 μm). In various embodiments configured for use and/or coupling to a multi-mode optical fiber, the mesa diameter $D_M$ is 20, 25, or 30 μm or wider (e.g., up to 125 μm). In various embodiments, even with a large window diameter (e.g., 15 μm≤$D_W$≤62.5 μm) and/or a large mesa diameter (e.g., 20≤$D_M$≤125 μm), the photodetector 200 is configured to operate at bandwidths greater than 50 GHz For example, the photodetector 200 of an example embodiment is configured for use with and/or coupling to a multi-mode optical fiber and for operation at data rates of 100 gigabits per second or more. As should be understood, some example embodiments are configured for use and/or coupling to single-mode optical fibers and may have accordingly smaller window diameters and/or mesa diameters and be configured to operate at bandwidths greater than 50 GHz and in some instances much greater than 50 G.

In various embodiments, an anti-reflective coating 245 is disposed on the first peripheral layer 140 within the optical window 240. In an example embodiment, the anti-reflecting coating 245 is configured to reduce optical back-reflection of light incident on the optical window 240. In various embodiments, the anti-reflective coating 245 comprises a dielectric material that has an optical thickness (e.g., in the direction substantially parallel to the detection axis 190) that is substantially equal to one quarter or three quarters (or other odd integer quarters (e.g., 5/4, 7/4, etc.)) of a wavelength for light characterized by the particular wavelength range. In an example embodiment, the anti-reflective coating 245 comprises a dielectric material that has a refractive index that is substantially equal to the square-root of the refractive index of InP (and/or other material of the collector layer 120 and/or first peripheral layer 140) for light characterized by the particular wavelength range.

Technical Advantages

As conventional photodetectors configured for use with single-mode optical fibers are configured to operate at bandwidths of 50 GHz or more and conventional photodetectors configured for use with multi-mode optical fibers are limited to bandwidths of about 30 GHz, there exist technical problems regarding the design and fabrication of photodetectors, especially photodetectors configured for use with multi-mode optical fibers, that are able to operate at higher bandwidths (e.g., greater than 50 GHz).

Various embodiments provide technical solutions to these technical problems. For example, various embodiments provide photodetectors comprising separate absorber regions and drift/collector regions that are configured to provide sufficiently high bandwidth even when the mesa diameter and optical window of the photodetector are sufficiently large enough for efficient optical coupling to a multi-mode optical fiber. Thus, various embodiments provide photodetectors that exhibit technical advantages and improvements over conventional photodetectors.

Generally, photodetectors, such as PIN-type photodiodes, for example, are characterized by a detector capacitance. The greater the detector capacitance, the longer it takes for the photodetector to adjust to changes in the incoming optical signal. In general, the detector capacitance is an inverse function of the thickness of the depletion region of the photodetector in the direction substantially parallel to the detection axis thereof (e.g., the distance between the first peripheral layer 140 and the second peripheral layer 150 and/or the combined thickness of the absorber region and the collector region). Thus, a thicker photodetector depletion region results in lower detector capacitance (e.g., with all other variables held constant).

However, the thicker the photodetector depletion region is in the direction substantially parallel to the detection axis thereof, the greater the distance to be traveled by the free carriers (e.g., free holes and/or free electrons) generated by the incoming light interacting with the absorbing material to result in detection of the incoming light. Thus, a thicker photodetector depletion region requires a longer drift time for the free carriers to reach respective electrodes such that an electrical signal corresponding to the absorbed light is generated, thereby reducing the bandwidth of the photodetector with increasing thickness (e.g., with all other variables held constant).

Various embodiments overcome these technical problems by providing photodetectors that have separate absorber regions and drift/collector regions. The material of the absorber region and/or absorber layer is configured to enable efficient absorption of light characterized by a particular wavelength range such that the absorber layer may be thin (e.g., 0.1 to 0.6 μm). The thinness of the absorber layer allows for short drift times for free holes and free electrons generated by interaction of light with the absorbing material of the absorber layer. The material of the drift/collector region is configured to cause high acceleration and fast transport of free electrons there across such that the drift/collector layer may be relatively thick (e.g., 1 to 3 μm) to provide a low detector capacitance while still enabling a short free electron drift time. The intermediate layer is doped so as to control the electric field in the absorber region and the drift/collector region to enable the efficient transport of free holes and free electrons thereacross. Various embodiments therefore provide photodetectors capable of operating at high bandwidth (e.g., greater than 50 GHz when the photodetector is configured for use and/or compatible with a multimode optical fiber and greater than 100 GHz when the photodetector is configured for use and/or compatible with a single mode optical fiber).

Moreover, due to the low capacitance per area (e.g., area taken in a plane perpendicular to the detection axis of the photodetector), photodetectors in accordance with various embodiments may be fabricated to have optical windows and/or mesa diameters that are large enough to enable efficient coupling to multi-mode optical fibers (e.g., window diameters greater than 15 μm, for example) while still enabling the photodetectors to operate at high bandwidth (e.g., greater than 50 GHz).

Therefore, various embodiments provide improvements to the field of high bandwidth photodetectors and multi-mode optical fiber compatible photodetectors. Various embodiments provide photodetectors exhibiting the technical advantages of being configured to operate at high bandwidth or being configured to operate at high bandwidth and being compatible with multi-mode optical fibers.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A PIN-photodetector, comprising:
a layer structure configured to detect light in a particular wavelength range of 960 nanometers to 1200 nanometers, wherein the layer structure defines a detection axis of the PIN-photodetector, and wherein the layer structure comprises:
an absorber region comprising InGaAs and/or InGaAsP having an absorption coefficient of greater than $10^4$ cm$^{-1}$ in the particular wavelength range, wherein the absorber region has an absorber thickness in a direction that is substantially parallel to the detection axis;
a collector region comprising InP that is substantially transparent to the particular wavelength range, wherein the collector region has a collector thickness in the direction that is substantially parallel to the detection axis; and
a peripheral layer having a first surface disposed adjacent the absorber region along the detection axis such that the absorber region is disposed between the peripheral layer and the collector region, wherein the absorber thickness of the absorber region extends from the first surface of the peripheral layer to a second surface of the collector region adjacent the absorber region,
wherein the collector thickness is greater than the absorber thickness, the absorber region does not spatially overlap with the collector region, and the PIN-photodetector is configured to operate at a bandwidth of at least 50 GHz.

2. The PIN-photodetector of claim 1, wherein an optical window of the PIN-photodetector is configured for use with a multi-mode optical fiber.

3. The PIN-photodetector of claim 1, wherein the InGaAs or InGaAsP is intrinsic or undoped InGaAs or InGaAsP.

4. The PIN-photodetector of claim 1, wherein the InP is intrinsic or undoped InP.

5. The PIN-photodetector of claim 1, wherein the collector region comprises an intermediate layer disposed between the absorber region and a collector layer of the collector region, wherein the absorber region comprises an absorber layer, and wherein the intermediate layer is doped so as to generate specific electric fields within the absorber layer and collector layer, respectively, that cause minimum carrier transport times.

6. The PIN-photodetector of claim 5, wherein the intermediate layer comprises n-type doped InP, n-type doped InGaAsP or n-type doped InGaAlAs.

7. The PIN-photodetector of claim 6, wherein respective crystal structures of the absorber region and the collector region are lattice-matched to a crystal structure of a substrate on which the PIN-photodetector is formed.

8. The PIN-photodetector of claim 5, wherein an electric field has an amplitude in a range of 5 to 15 kV/cm in the collector layer.

9. The PIN-photodetector of claim 5, wherein an electric field has an amplitude of 2 to 60 kV/cm in the absorber layer.

10. The PIN-photodetector of claim 5, wherein the peripheral layer is a first peripheral layer and is doped with a p-type dopant, and wherein the layer structure comprises a second peripheral layer that is doped with an n-type dopant.

11. The PIN-photodetector of claim 10, further comprising a first contact layer formed on a portion of the first peripheral layer and in electrical communication with the first peripheral layer, wherein an aperture in the first contact layer defines an optical window of the PIN-photodetector.

12. The PIN-photodetector of claim 11, further comprising a first contact pad, wherein the first contact layer is disposed between the first contact pad and the first peripheral layer, and wherein the first contact layer comprises p-type doped InGaAs and is not present in the optical window.

13. The PIN-photodetector of claim 11, further comprising an anti-reflective coating layer disposed within the optical window.

14. The PIN-photodetector of claim 10, wherein the second peripheral layer is in electrical communication with a second contact pad.

15. The PIN-photodetector of claim 10, comprising:
a first contact layer formed on the first peripheral layer, wherein the first peripheral layer, the absorber region, the collector region, and the second peripheral layer form a photodetector mesa on a substrate; and
a cladding disposed about the photodetector mesa such that an exposed surface of the PIN-photodetector and an exposed surface of the cladding are substantially planar with respect to one another.

16. The PIN-photodetector of claim 1, wherein the absorber thickness is substantially equal to or greater than an absorption length of the absorber region.

17. The PIN-photodetector of claim 1, wherein the absorber thickness is within a range of 0.1 to 0.6 μm and the collector thickness is within a range of 1 to 3 μm.

18. The PIN-photodetector of claim 1, wherein the peripheral layer is doped with a p-type dopant.

19. The PIN-photodetector of claim 1, comprising an optical window having a window diameter of greater than or equal to 15 μm.

20. The PIN-photodetector of claim 1, comprising an optical window having a window diameter of greater than or equal to 15 μm and less than or equal to 62.5 μm.

* * * * *